United States Patent
Huang et al.

(10) Patent No.: US 8,692,358 B2
(45) Date of Patent: Apr. 8, 2014

(54) IMAGE SENSOR CHIP PACKAGE AND METHOD FOR FORMING THE SAME

(76) Inventors: Yu-Lung Huang, Daxi Township (TW); Tzu-Hsiang Hung, Kaohsiung (TW); Yen-Shih Ho, Kaohsiung (TW)

( * ) Notice: Subject to any disclaimer, the term of this patent is extended or adjusted under 35 U.S.C. 154(b) by 99 days.

(21) Appl. No.: 13/217,999

(22) Filed: Aug. 25, 2011

(65) Prior Publication Data
US 2012/0049307 A1 Mar. 1, 2012

Related U.S. Application Data

(60) Provisional application No. 61/377,223, filed on Aug. 26, 2010.

(51) Int. Cl.
| | | |
|---|---|---|
| H01L 29/40 | (2006.01) | |
| H01L 23/52 | (2006.01) | |
| H01L 23/48 | (2006.01) | |
| H01L 31/0232 | (2006.01) | |
| H01L 29/22 | (2006.01) | |
| H01L 23/538 | (2006.01) | |

(52) U.S. Cl.
USPC .... 257/621; 257/774; 257/432; 257/E23.174; 257/99

(58) Field of Classification Search
USPC .............. 257/99, 100, 432, 621, 774
See application file for complete search history.

(56) References Cited

U.S. PATENT DOCUMENTS

| 7,180,149 B2 * | 2/2007 | Yamamoto et al. | 257/434 |
| 2008/0277799 A1 * | 11/2008 | Benson et al. | 257/774 |
| 2008/0284041 A1 | 11/2008 | Jang et al. | |

FOREIGN PATENT DOCUMENTS

JP    2008-288449    11/2008

* cited by examiner

*Primary Examiner* — Luan C Thai
(74) *Attorney, Agent, or Firm* — Liu & Liu (57) ABSTRACT

A method for forming an image sensor chip package includes: providing a substrate having predetermined scribe lines defined thereon, wherein the predetermined scribe lines define device regions and each of the device regions has at least a device formed therein; disposing a support substrate on a first surface of the substrate; forming at least a spacer layer between the support substrate and the substrate, wherein the spacer layer covers the predetermined scribe lines; forming a package layer on a second surface of the substrate; forming conducting structures on the second surface of the substrate, wherein the conducting structures are electrically connected to the corresponding device in corresponding one of the device regions, respectively; and dicing along the predetermined scribe lines such that the support substrate is removed from the substrate and the substrate is separated into a plurality of individual image sensor chip packages.

8 Claims, 12 Drawing Sheets

IMAGE SENSOR CHIP PACKAGE AND METHOD FOR FORMING THE SAME

CROSS REFERENCE TO RELATED APPLICATIONS

This Application claims the benefit of U.S. Provisional Application No. 61/377,223, filed on Aug. 26, 2010, the entirety of which is incorporated by reference herein.

BACKGROUND OF THE INVENTION

1. Field of the Invention

The present invention relates to a chip package, and in particular relates to an image sensor chip package.

2. Description of the Related Art

An image sensor chip package typically includes an image sensor chip and a transparent substrate disposed thereon. The transparent substrate may serve as a support during the fabrication process of the image sensor chip package such that the fabrication process is favorably performed.

However, the transparent substrate may more or less absorb, refract, and/or reflect a portion of the light entering a sensing device region of the image sensor chip package, thus affecting the image sensing quality of the image sensor chip. In addition, because of the lighter and smaller product trends for electronic products, the existence of the transparent substrate hinders the degree in which an image sensor chip package may be shrunk. Meanwhile, a transparent substrate having a sufficient optical quality is not cheap.

Thus, it is desired to reduce the affection on light sensing due to the transparent substrate and further reduce the size of the image sensor chip package.

BRIEF SUMMARY OF THE INVENTION

An embodiment of the invention provides a method for forming an image sensor chip package, comprising: providing a substrate having a plurality of predetermined scribe lines defined thereon, wherein the predetermined scribe lines define a plurality of device regions in the substrate and each of the device regions has at least a device formed therein; disposing a support substrate on a first surface of the substrate; forming at least a spacer layer between the support substrate and the substrate, wherein the spacer layer overlaps the predetermined scribe lines; forming a package layer on a second surface of the substrate; forming a plurality of conducting structures on the second surface of the substrate, wherein the conducting structures are electrically connected to the corresponding device in corresponding one of the device regions, respectively; and performing a dicing process including dicing the support substrate, the spacer layer, and the substrate along the predetermined scribe lines such that the support substrate is removed from the substrate and the substrate is separated into a plurality of individual image sensor chip packages.

An embodiment of the invention provides an image sensor chip package, comprising: an image sensor chip having an upper surface and a lower surface and having a light sensing device disposed at the upper surface; an optical element disposed on the light sensing device, wherein the optical element has a light receiving surface; a conducting layer extending from the lower surface towards the upper surface of the image sensor chip and electrically connected to the light sensing device; and a package layer formed on the lower surface of the image sensor chip and the conducting layer, wherein a shortest distance between the light receiving surface and a bottom surface of the package layer is not larger than about 130 µm.

An embodiment of the invention provides an image sensor chip package, comprising: an image sensor chip having an upper surface and a lower surface and having a light sensing device disposed at the upper surface; an optical element disposed on the light sensing device, wherein the optical element has a light receiving surface; a conducting layer extending from the lower surface towards the upper surface of the image sensor chip and electrically connected to the light sensing device; and a package layer formed on the lower surface of the image sensor chip and the conducting layer, wherein no support substrate is disposed on the light receiving surface.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for using the embodiments of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an image sensor chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
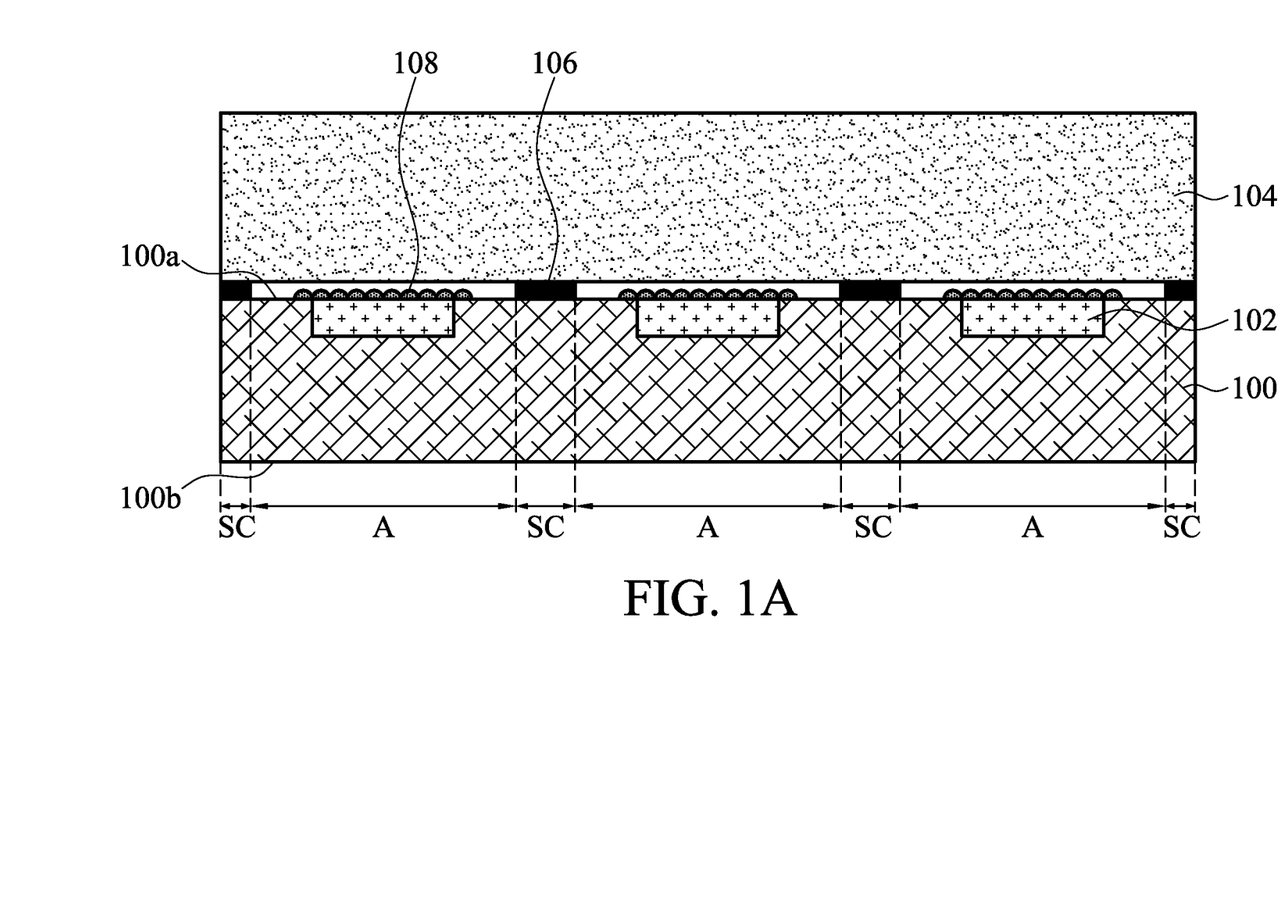
FIGS. 1A-1K are cross-sectional views showing the steps of forming an image sensor chip package according to an embodiment of the present invention.

FIGS. 1A-1K are cross-sectional views showing the steps of forming an image sensor chip package according to an embodiment of the present invention. As shown in FIG. 1A, a substrate 100 is provided, which is, for example, a semiconductor substrate. In one embodiment, the substrate 100 is a silicon wafer, and thus a wafer-level package process may be performed to reduce fabrication time and cost. The substrate 100 may include a plurality of predetermined scribe lines SC defined therein. The predetermined scribe lines SC define a plurality of device regions A in the substrate 100. The device regions A may include at least a device 102 formed therein, respectively. The device 102 may be a variety of electronic devices such as (but is not limited to) an image sensor device. If the device 102 is an image sensor device or another optoelectronic device, an optical element 108 may be optionally disposed on the device 102. The optical element 108 may be, for example, (but is not limited to) a microlens or a microlens array.

Figure 2:
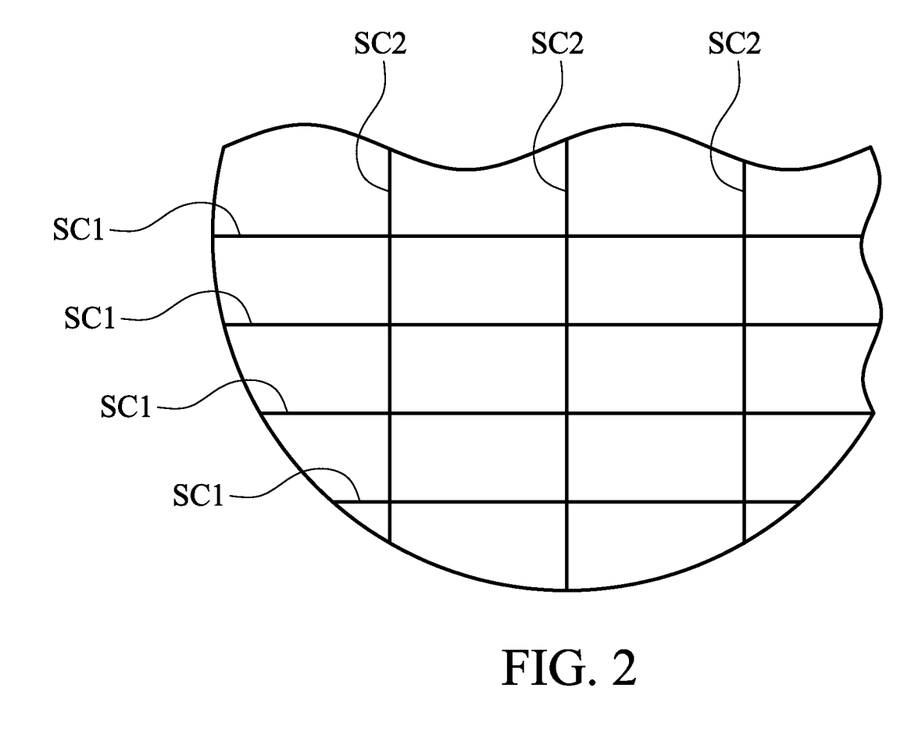
FIG. 2 is a top view showing a substrate in an embodiment of the present invention.

FIG. 2 shows a top view of the substrate 100 in one embodiment. The predetermined scribe lines SC of the substrate 100 may include a plurality of first direction predetermined scribe lines SC1, which are substantially parallel to a first direction, and a plurality of second direction predetermined scribe lines SC2, which are substantially parallel to a second direction. In one embodiment, the first direction is substantially perpendicular to the second direction.

Referring to FIG. 1A, a support substrate 104 is disposed on a surface 100a of the substrate 100. The support substrate 104 may be a transparent substrate such as a glass substrate. In one embodiment, a spacer material layer is first formed on a surface of the support substrate 104 facing the surface of the substrate, and then the spacer material layer is patterned into at least a spacer layer 106. The pattern of the spacer layer 106 may be substantially similar to and corresponds to the predetermined scribe lines SC of the substrate 100. When the support substrate 104 is disposed on the substrate 100, the spacer layer 106 may bond with the substrate 100 and may cover and overlap the predetermined scribe lines SC of the substrate 100.

Figure 1B:
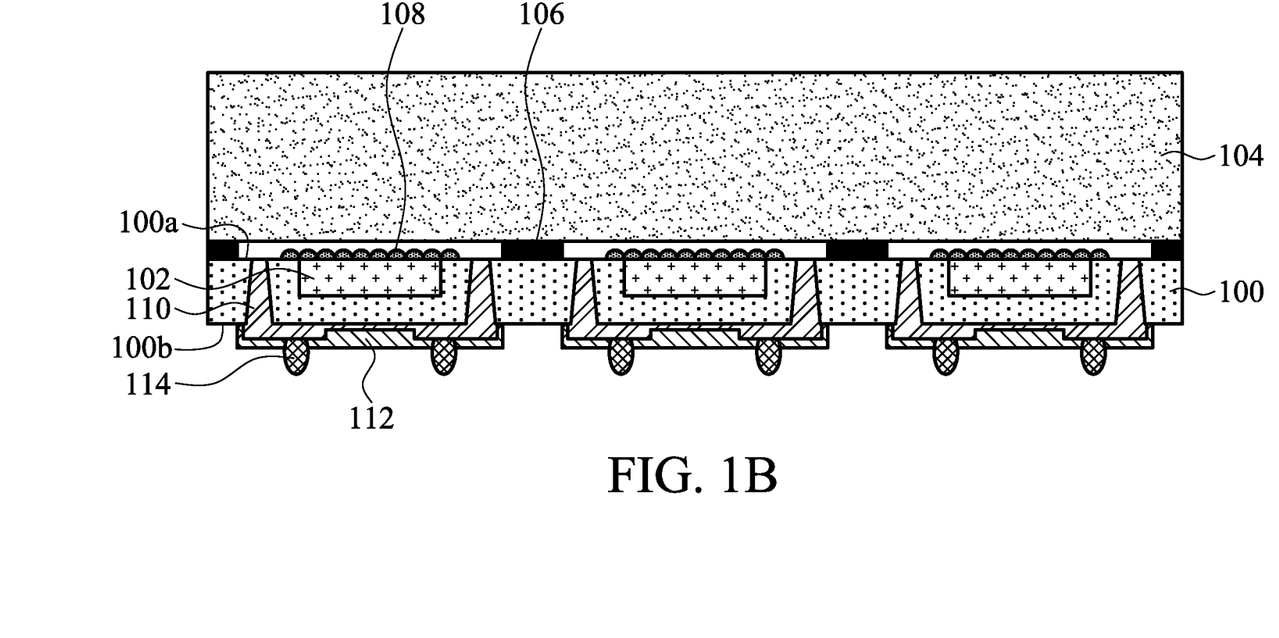

Next, as shown in FIG. 1B, the support substrate 104 may then be used as a support and following process steps are performed on the surface 100b of the substrate 100. For example, a thinning process may be performed on the surface 100b of the substrate 100 to thin the substrate 100 to a predetermined thickness. A suitable thinning process is, for example, a grinding process or a chemical mechanical polishing (CMP) process. Then, a plurality of through substrate conducting structures 110 may be formed in the substrate 100. The through substrate conducting structures 110 may be electrically connected to corresponding devices. For example, in one embodiment, the substrate 100 includes a conducting pad (not shown) electrically connected to the device 102. In this case, a through-hole exposing the conducting pad may be formed, and the through-hole may be filled with a conducting material to form the through-substrate conducting structure 110. The through substrate conducting structures 110 may further include a conducting layer extending on the surface 100b of the substrate 100. In one embodiment, in order to prevent a short between the through substrate conducting structures 110 and the substrate 100, an insulating layer (not shown) may be formed between the substrate 100 and the through substrate conducting structure 110.

In one embodiment, after the through-hole exposing the conducting pad is formed, an insulating layer may be conformally formed on a sidewall and a bottom of the through-hole. For example, the insulating layer may be formed by chemical vapor deposition. Then, the insulating layer located on the bottom of the through-hole is removed to expose the conducting pad. Then, an electroplating seed layer is formed on the sidewall and the bottom of the through-hole by, for example, physical vapor deposition. The electroplating seed layer may extend onto the surface 100b of the substrate 100. Then, a patterned mask layer may be formed on the electroplating seed layer, and a conducting layer is electroplated on the exposed electroplating seed layer. Then, the patterned mask layer is removed, and the portion of the electroplating seed layer where no conducting layer is formed is etched and removed. Thus, the through substrate conducting structures 110 is formed in the substrate 100, which may further include a patterned conducting layer extending on the surface 100b of the substrate 100.

As shown in FIG. 1B, a package layer 112 and a conducting structure 114 may then be formed on the surface 100b of the substrate 100. The package layer 112 may be, for example, (but is not limited to) a solder mask layer. The conducting structure 114 is, for example, a solder ball, and may be electrically connected to the device 102 through the through substrate conducting structures 110.

Then, a dicing process is performed, which may include dicing the support substrate 104, the spacer layer 106, and the substrate 100 along the predetermined scribe lines SC such that the support substrate 104 is separated from the substrate 100, and the substrate 100 is divided into a plurality of separate image sensor chip packages. The dicing process according to an embodiment of the present invention is further illustrated in more detail in the following.

Figure 1C:
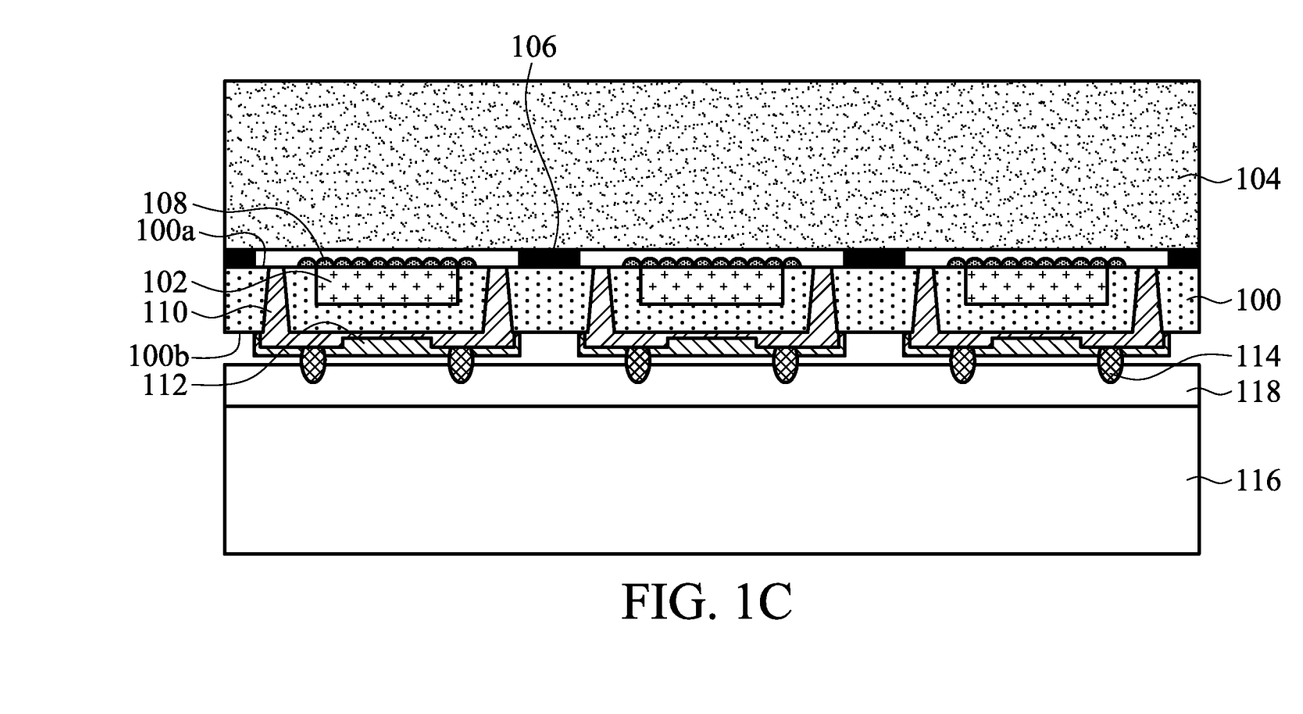

As shown in FIG. 1C, in one embodiment, before the dicing process is performed, a support substrate 116 may be optionally disposed on the surface 100b of the substrate 100 to facilitate following processes. The support substrate 116 may be adhered on the surface 100b of the substrate 100 through, for example, an adhesion layer 118. The adhesion layer 118 may be a two-sided UV tape, wherein a side of the two-sided UV tape is adhered onto the support substrate 116, and another side of the two-sided UV tape is adhered onto the conducting structure 114 on the surface 100b of the substrate 100.

Figure 1D:
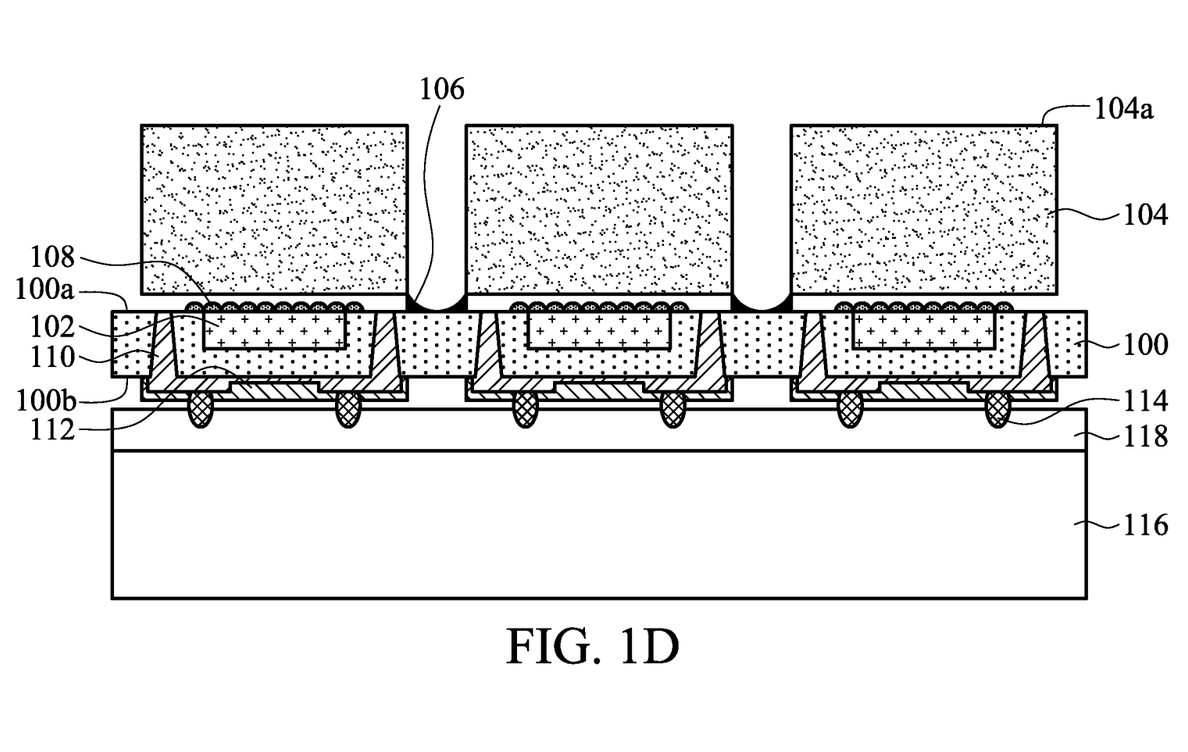

In one embodiment, the dicing process is stepwise performed. Referring to FIGS. 1D and 2, a portion of the support substrate 104 and a portion of the spacer layers 106 covering the first direction predetermined scribe lines SC may be diced and removed from the surface 104a of the support substrate 104 along the first direction predetermined scribe lines SC1. In one embodiment, a fix layer (not shown) may be optionally formed on the surface 104a of the support substrate 104 to facilitate following dicing processes. The fix layer may be an adhesive tape. When the portion of the support substrate 104 and the spacer layers 106 on the first direction predetermined scribe lines SC1 are diced and removed, the fix layer may be used to hold the support substrate 104.

Figure 1E:
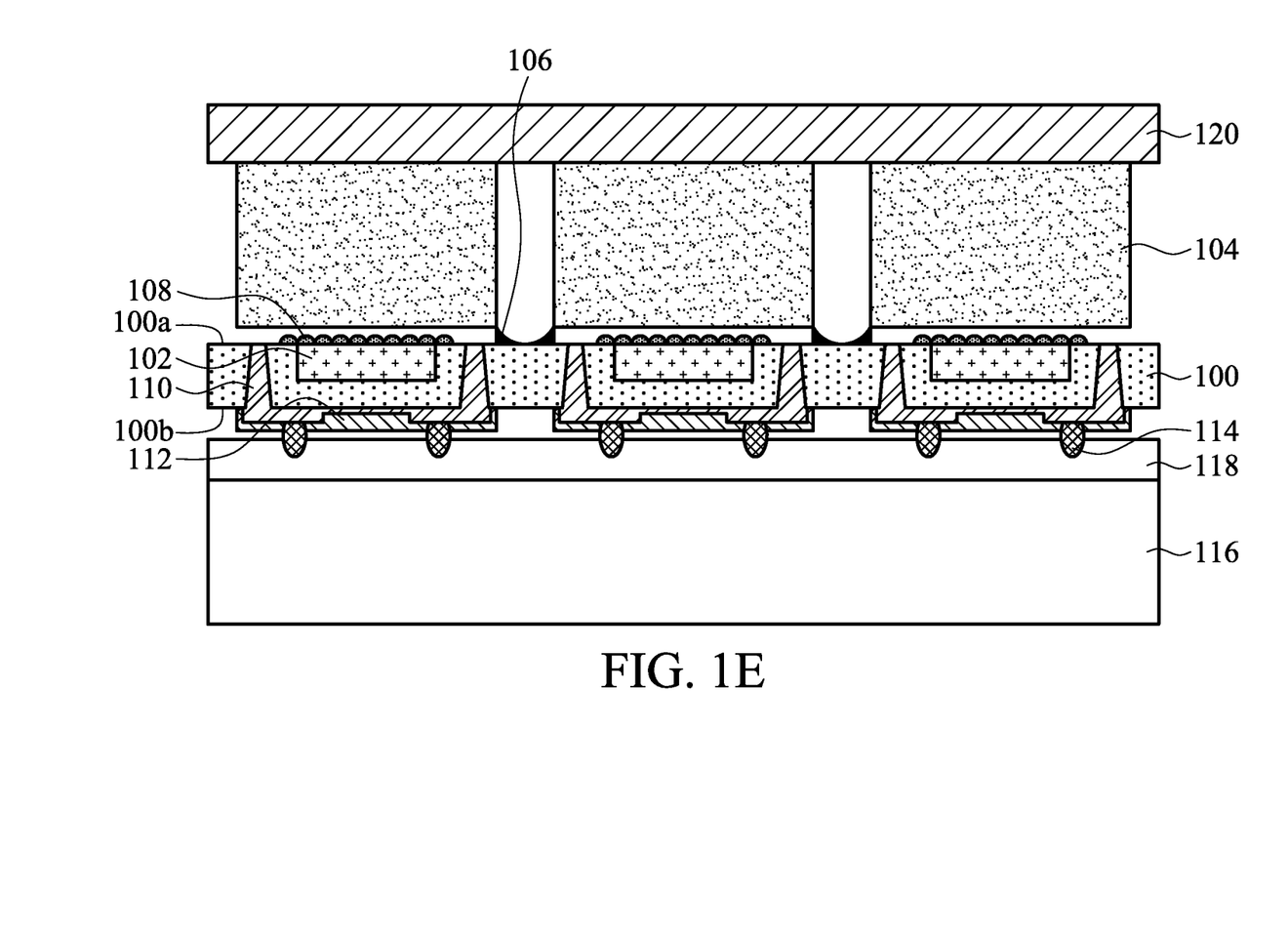

As shown in FIG. 1E, after the portion of the support substrate 104 is diced and removed, a fix layer 120 is formed on the surface 104a of the support substrate 104 to facilitate following dicing processes. The fix layer 120 may be an adhesive tape.

Figure 1F:
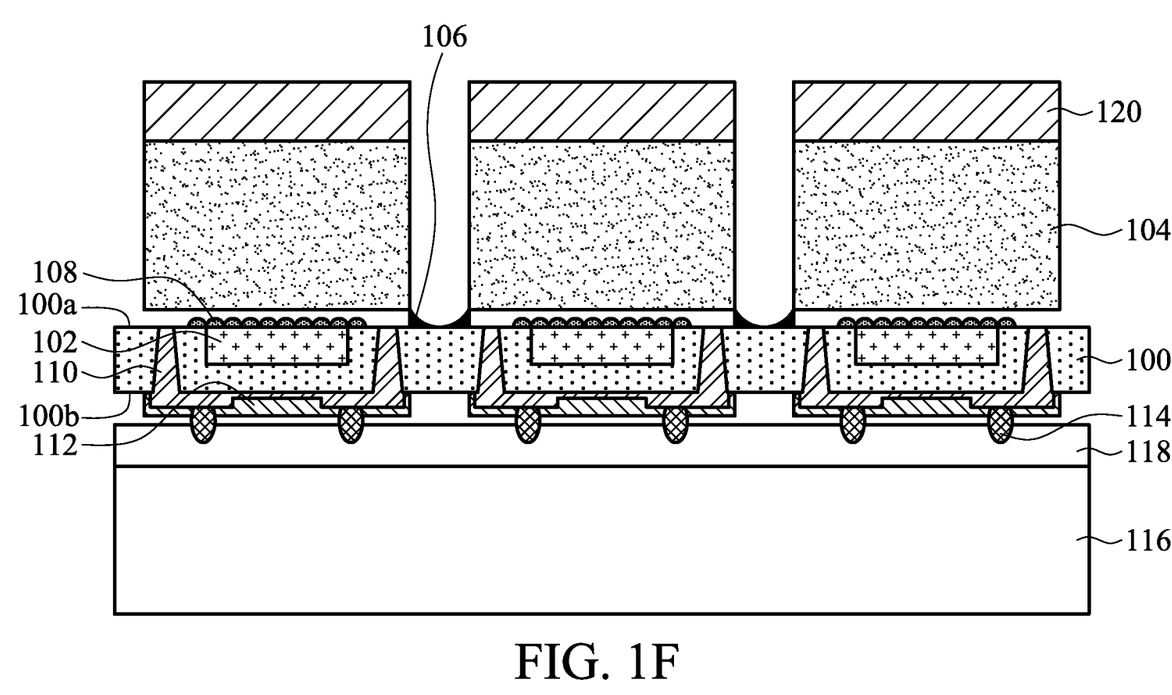
Figure 1G:
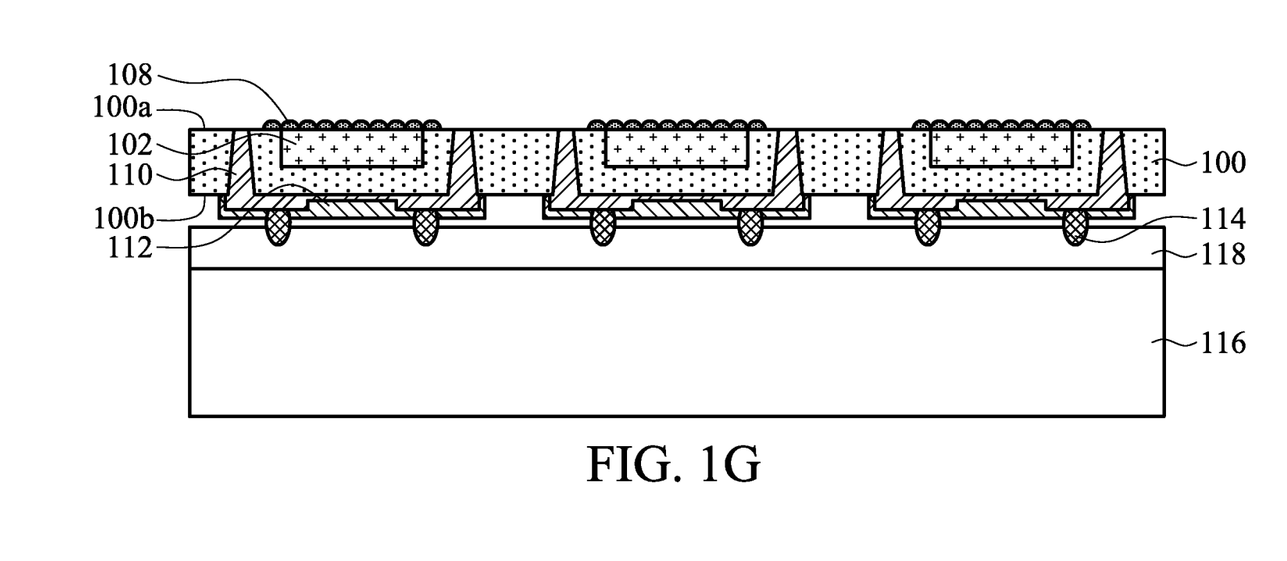

As shown in FIG. 1F, a portion of the fix layer 120, a portion of the support substrate 104, and a portion of the spacer layers 106 covering the second direction predetermined scribe lines SC2 are then diced and removed from the surface 104a of the support substrate 104 along the second direction predetermined scribe lines SC2. Because the support substrate 104 is fixed on the substrate 100 through the spacer layers 106, when the spacer layers 106 on the scribe lines (SC1 and SC2) are substantially and completely removed in the dicing process, the support layer 104 and the fix layer 120 are naturally separated from the substrate 100, as shown in FIG. 1G.

Figure 1H:
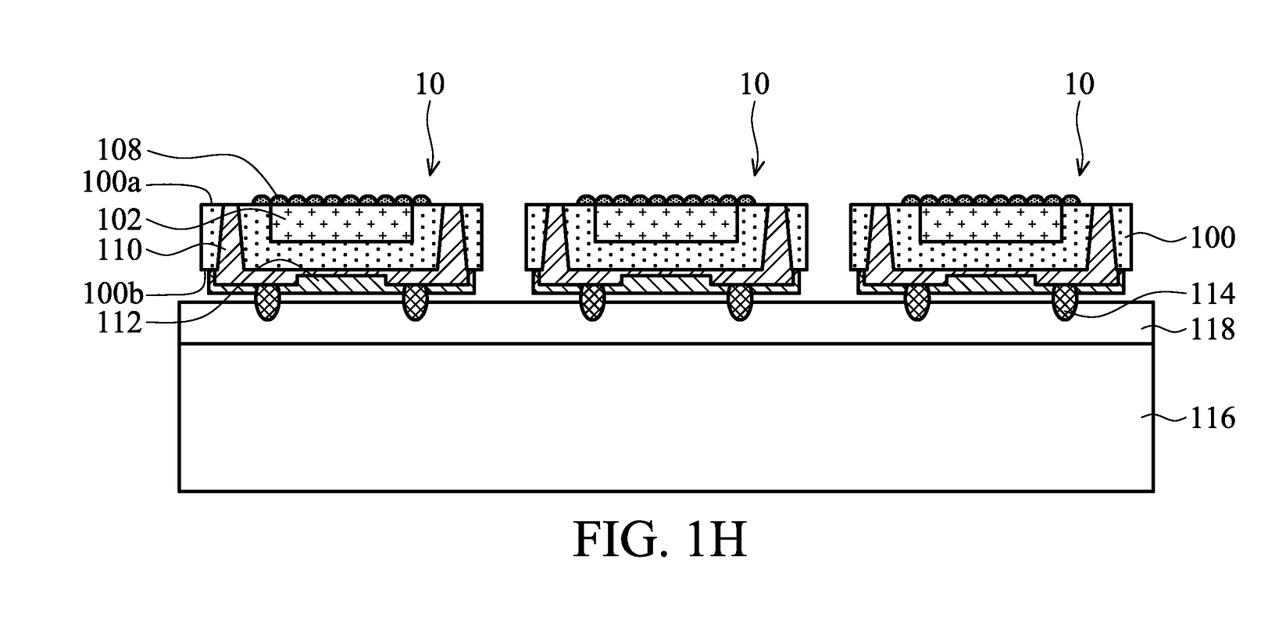

Next, as shown in FIG. 1H, after the support substrate 104 and the fix layer 120 are removed from the substrate 100, a portion of the substrate 100 may be diced and removed from the surface 100a of the substrate 100 along the first direction predetermined scribe lines SC1 and the second direction predetermined scribe lines SC2 such that the substrate 100 is separated into a plurality of image sensor chip packages 10 which are separated from each other.

Due to the dicing process mentioned above, the support substrate 104 may be naturally removed after the dicing process is performed. Thus, the size of the image sensor package 10 may be reduced. Further, because the support substrate 104 is removed, light may be received by the device 102 more favorably. Note that because the support substrate 104 is merely used as a temporary support substrate, the optical quality of the support substrate may not need to be as good as that of a transparent substrate (top cover) of a conventional image sensor chip package. Thus, fabrication cost may be reduced.

Figure 1I:
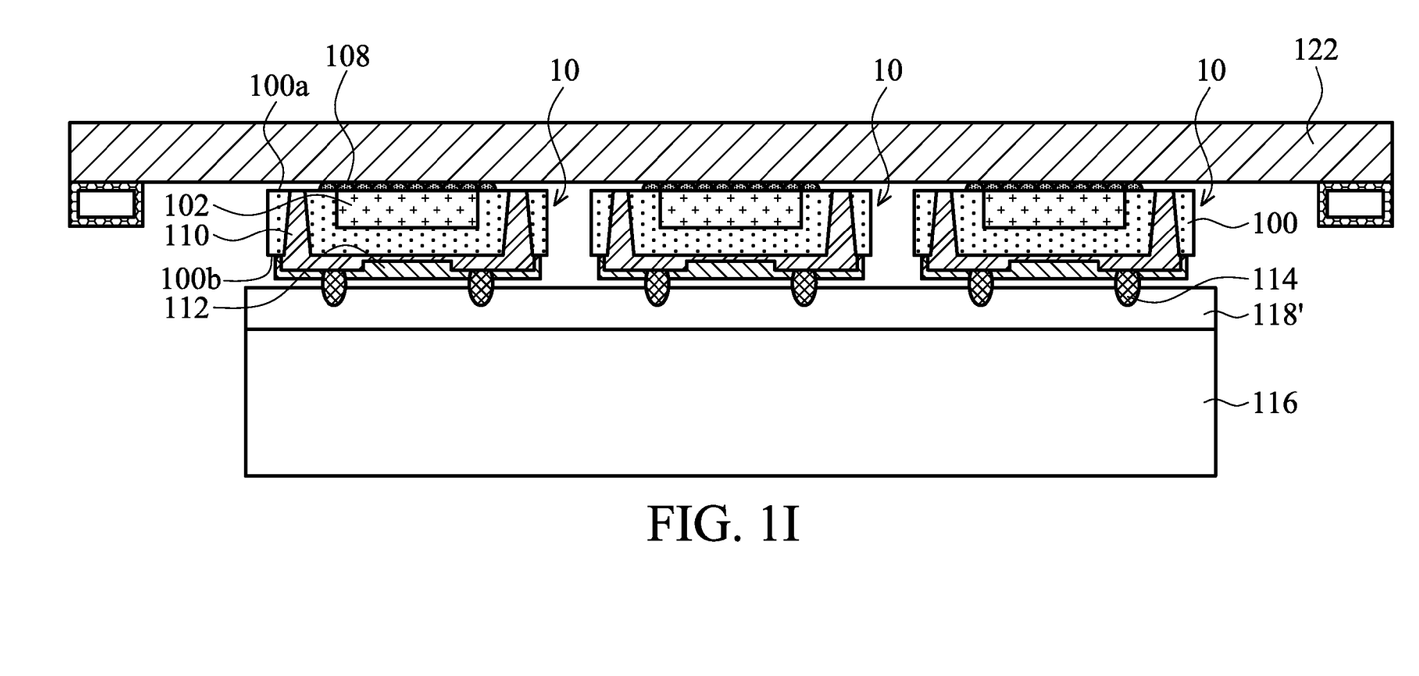

As shown in FIG. 1I, for the convenience of transportation and/or processing of the formed plurality of image sensor chip packages 10, a film frame 122 may be further attached on the image sensor chip packages. In one embodiment, a process (such as light irradiation process or another suitable process) may be first applied to the adhesion layer 118 to reduce the adhesion of the adhesion layer 118 to transform the adhesion layer into an adhesion layer 118' with low adhesion for easy removal in a following process.

Figure 1J:
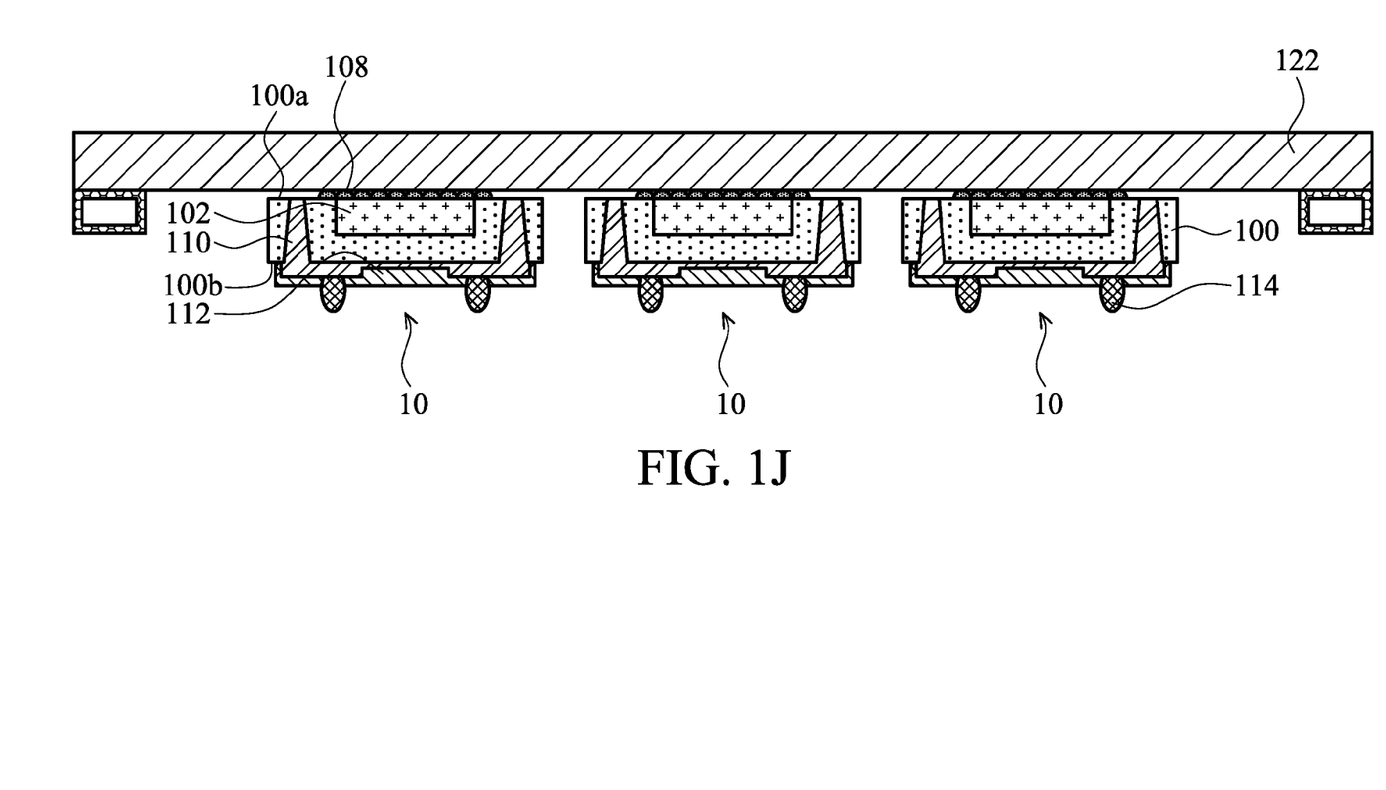

As shown in FIG. 1J, because the treated adhesion layer 118' has a low adhesion, the adhesion layer 118' and the support substrate 116 may be removed from the image sensor chips 10, which have been separated, more easily.

The plurality of image sensor chip packages 10 fixed on the film frame 122 may then be picked up according to requirements and be integrated into another electronic element, such as a printed circuit board.

Figure 1K:
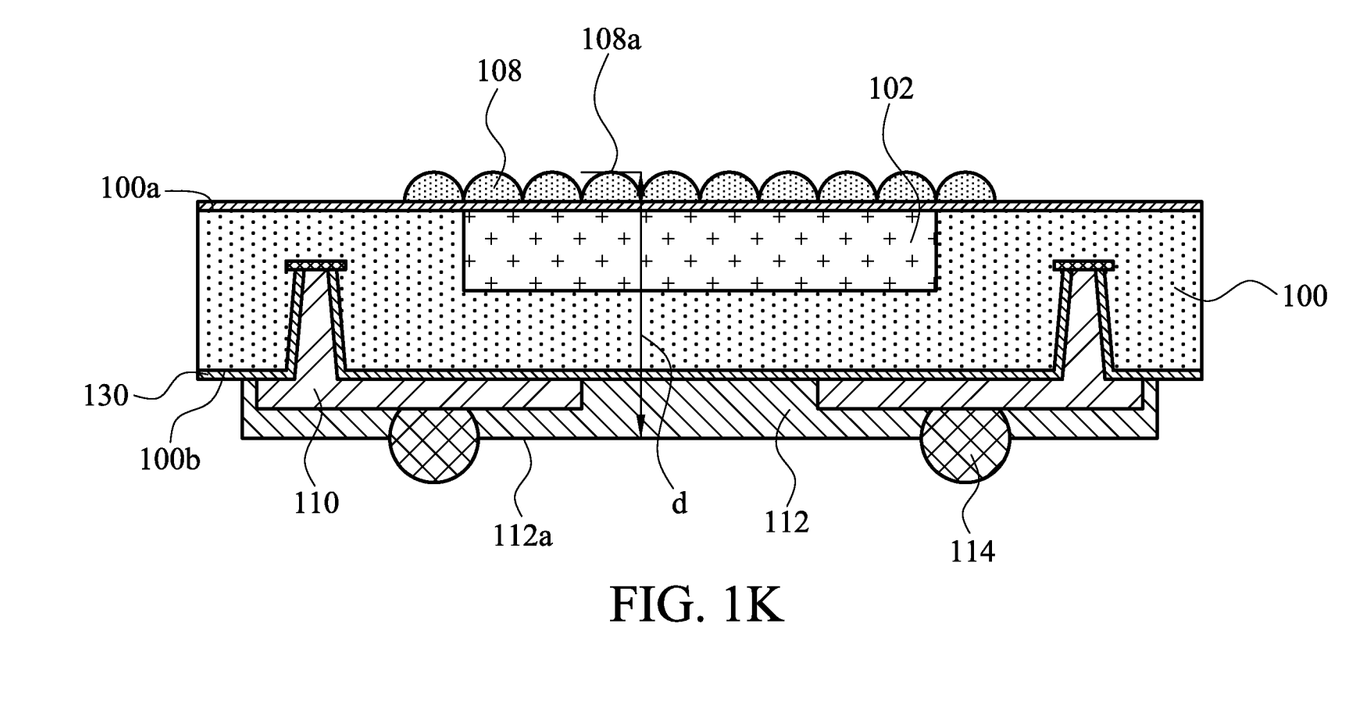

FIG. 1K is a cross-sectional view showing an image sensor chip package 10 according to an embodiment of the present invention. In one embodiment, the image sensor chip package 10 includes an image sensor chip 100 (i.e., a portion of the substrate 100 after being diced), which has an upper surface 100a and a lower surface 100b, wherein a light sensing device 102 is disposed at the upper surface 100a. In one embodiment, an optical element 108 is disposed on the light sensing device 102. The optical element 108 may be another element (such as a microlens array) disposed on the light sensing device 102 or may be a portion of the light sensing device 102. That is, in one embodiment, the light sensing device 102 includes the optical element 108. The optical element 108 has a light receiving surface 108a.

The image sensor chip package 10 further includes a conducting layer (which includes a through substrate conducting structure 110) extending from the lower surface 100b towards the upper surface 100a of the image sensor chip 100 and electrically connecting to the light sensing device 102. A package layer 112 is formed on the lower surface 100b of the image sensor chip 100 and the conducting layer, wherein a shortest distance dl between the light receiving surface 108a and a bottom surface 112a of the package layer 112 is not larger than about 130 μm. In one embodiment, the shortest distance d is between about 10 μm and about 100 μm. In another embodiment, the shortest distance d is between about 20 μm and about 80 μm. The distance d of the image sensor chip package according to embodiments of the invention may be significantly reduced.

In one embodiment, because no support substrate is disposed on the light receiving surface 108a of the optical element 108, the size of the image sensor chip package 10 is much thinner when compared to that of the conventional image sensor chip package, and thus the image sensor chip package may be applied to electronic products, which are light, thin, short, and small, such as mobile phones. Note that because no support substrate is disposed on the light receiving surface 108a of the image sensor chip package 10 according to embodiments of the invention, light may be received by the light sensing device 102 more favorably to achieve better light sensing quality.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor chip package, comprising:
    a diced image sensor chip having an upper surface and a lower surface and having a light sensing device disposed at the upper surface;
    an optical element disposed on the light sensing device, wherein the optical element has a light receiving surface and the optical element is exposed to air, and wherein no support substrate is disposed on the light receiving surface of the optical element;
    a conducting layer extending from the lower surface towards the upper surface of the diced image sensor chip and electrically connected to the light sensing device; and
    a package layer formed on the lower surface of the diced image sensor chip and the conducting layer, wherein a shortest distance between the light receiving surface and a bottom surface of the package layer is not larger than about 130 μm.

2. The image sensor chip package as claimed in claim 1, wherein the optical element comprises a microlens.

3. The image sensor chip package as claimed in claim 1, further comprising at least a solder ball disposed on the lower surface of the diced image sensor chip and electrically connected to the conducting layer.

4. The image sensor chip package as claimed in claim 1, further comprising a hole extending from the lower surface towards the upper surface of the diced image sensor chip, wherein a portion of the conducting layer is located in the hole.

5. An image sensor chip package, comprising:
    a diced image sensor chip having an upper surface and a lower surface and having a light sensing device disposed at the upper surface;

an optical element disposed on the light sensing device, wherein the optical element has a light receiving surface and the optical element is exposed to air, and wherein no support substrate is disposed on the light receiving surface of the optical element;

a conducting layer extending from the lower surface towards the upper surface of the diced image sensor chip and electrically connected to the light sensing device; and a package layer formed on the lower surface of the diced image sensor chip and the conducting layer, wherein no support substrate is disposed on the light receiving surface.

6. The image sensor chip package as claimed in claim 5, further comprising a hole extending from the lower surface towards the upper surface of the diced image sensor chip, wherein a portion of the conducting layer is located in the hole.

7. The image sensor chip package as claimed in claim 1, wherein the upper and lower surfaces define a thickness of the diced image sensor chip, and wherein the conducting layer extends to less than entire thickness defined between the upper and lower surfaces of the diced image sensor chip.

8. The image sensor chip package as claimed in claim 5, wherein the upper and lower surfaces define a thickness of the diced image sensor chip, and wherein the conducting layer extends to less than entire thickness defined between the upper and lower surfaces of the image sensor chip.

* * * * *